(12) United States Patent
Shih

(10) Patent No.: US 12,100,634 B2
(45) Date of Patent: Sep. 24, 2024

(54) SEMICONDUCTOR DEVICE WITH RE-FILL LAYER

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 290 days.

(21) Appl. No.: 17/500,026

(22) Filed: Oct. 13, 2021

(65) Prior Publication Data

US 2023/0113020 A1 Apr. 13, 2023

(51) Int. Cl.
| | | |
|---|---|---|
| H01L 21/00 | (2006.01) |
| H01L 23/00 | (2006.01) |
| H01L 23/29 | (2006.01) |
| H01L 23/31 | (2006.01) |
| H01L 25/065 | (2023.01) |

(52) U.S. Cl.
CPC ........ *H01L 23/3135* (2013.01); *H01L 23/291* (2013.01); *H01L 23/3128* (2013.01); *H01L 24/08* (2013.01); *H01L 25/0657* (2013.01); H01L 2224/08146 (2013.01); H01L 2225/06527 (2013.01); H01L 2225/06541 (2013.01); H01L 2225/06548 (2013.01); H01L 2225/06586 (2013.01); H01L 2924/182 (2013.01); H01L 2924/183 (2013.01); H01L 2924/3512 (2013.01)

(58) Field of Classification Search
CPC .......................... H01L 23/3135; H01L 23/291; H01L 23/3128
See application file for complete search history.

(56) References Cited

U.S. PATENT DOCUMENTS

| | | | | |
|---|---|---|---|---|
| 6,580,170 | B2* | 6/2003 | Swanson | H01L 21/56 257/725 |
| 6,787,397 | B2* | 9/2004 | Swanson | H01L 23/291 438/762 |
| 11,581,281 | B2* | 2/2023 | Yu | H01L 24/08 |
| 11,587,901 | B2* | 2/2023 | Shih | H01L 24/19 |
| 11,646,292 | B2* | 5/2023 | Shih | H01L 23/3128 438/106 |
| 2002/0011656 | A1* | 1/2002 | Swanson | H01L 23/3192 257/E23.118 |
| 2003/0148590 | A1* | 8/2003 | Kellar | H01L 24/13 257/E21.705 |
| 2003/0205812 | A1* | 11/2003 | Swanson | H01L 23/3171 257/E23.118 |

(Continued)

FOREIGN PATENT DOCUMENTS

| | | | | |
|---|---|---|---|---|
| CN | 107665887 A | * | 2/2018 | .......... H01L 21/563 |
| TW | 200611327 A | | 4/2006 | |

(Continued)

*Primary Examiner* — Laura M Menz
(74) *Attorney, Agent, or Firm* — MUNCY, GEISSLER, OLDS & LOWE, P.C.

(57) ABSTRACT

The present application discloses a semiconductor device with a re-fill layer. The semiconductor device includes a chip stack including a first base die; a first stacked die positioned on a front surface of the first base die; and a re-fill layer positioned on a sidewall of the stacked die. The re-fill layer includes silicon oxide, silicon nitride, silicon oxynitride, silicon nitride oxide, titanium oxide, aluminum oxide, or hafnium oxide.

17 Claims, 16 Drawing Sheets

(56) References Cited

U.S. PATENT DOCUMENTS

| | | | |
|---|---|---|---|
| 2014/0353838 A1* | 12/2014 | Lin | H01L 23/055 257/773 |
| 2018/0315672 A1* | 11/2018 | Cassier | H01L 22/32 |
| 2020/0105711 A1* | 4/2020 | Kuo | H01L 23/544 |
| 2021/0398879 A1* | 12/2021 | Huang | H01L 21/76802 |
| 2021/0407942 A1* | 12/2021 | Yu | H01L 25/0652 |
| 2022/0013425 A1* | 1/2022 | Huang | H01L 25/0657 |
| 2022/0223565 A1* | 7/2022 | Chen | H01L 24/08 |
| 2022/0310480 A1* | 9/2022 | Bao | H01L 24/19 |
| 2022/0310545 A1* | 9/2022 | Shih | H01L 24/19 |
| 2022/0367415 A1* | 11/2022 | Huang | H01L 24/80 |
| 2023/0025662 A1* | 1/2023 | Chang | H01L 25/50 |
| 2023/0060355 A1* | 3/2023 | Shih | H01L 25/0657 |
| 2023/0065248 A1* | 3/2023 | Zhou | H01L 21/568 |
| 2023/0079072 A1* | 3/2023 | Huang | H01L 24/80 257/532 |
| 2023/0110531 A1* | 4/2023 | Shih | H01L 23/3171 438/106 |
| 2023/0113020 A1* | 4/2023 | Shih | H01L 21/78 257/787 |
| 2023/0127860 A1* | 4/2023 | Huang | H01L 24/05 257/777 |
| 2023/0170320 A1* | 6/2023 | Yu | H01L 25/03 257/777 |
| 2023/0178494 A1* | 6/2023 | Shih | H01L 23/544 |
| 2023/0187307 A1* | 6/2023 | Yu | H01L 25/105 257/213 |

FOREIGN PATENT DOCUMENTS

| | | |
|---|---|---|
| TW | 201214626 A | 4/2012 |
| TW | 202013740 A | 4/2020 |
| TW | 202135280 A | 9/2021 |

\* cited by examiner

SEMICONDUCTOR DEVICE WITH RE-FILL LAYER

TECHNICAL FIELD

The present disclosure relates to a semiconductor device, and more particularly, to a semiconductor device with a re-fill layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a chip stack including a first base die; a first stacked die positioned on a front surface of the first base die; and a re-fill layer positioned on a sidewall of the stacked die. The re-fill layer includes silicon oxide, silicon nitride, silicon oxynitride, silicon nitride oxide, titanium oxide, aluminum oxide, or hafnium oxide.

In some embodiments, a thickness of the re-fill layer is between about 50 angstroms and about 1000 angstroms.

In some embodiments, a width of the first base die is greater than a width of the stacked die.

In some embodiments, the semiconductor device includes a first molding layer positioned on the re-fill layer and opposite to the stacked die.

In some embodiments, the chip stack further includes a bottom passivation layer on a back surface of the first base die, and the front surface of the first base die and the back surface of the first base die are opposite to each other.

In some embodiments, the chip stack further includes a first connector positioned under the bottom passivation layer and opposite to the first base die.

In some embodiments, the semiconductor device includes a package substrate, wherein the chip stack is positioned on the package substrate.

In some embodiments, the semiconductor device includes a second connector positioned under the package substrate.

In some embodiments, a width of the package substrate is greater than a width of the chip stack.

In some embodiments, the semiconductor device includes a second molding layer positioned on the package substrate and covering the chip stack.

In some embodiments, the re-fill layer further horizontally positioned on the front surface of the first base die.

Another aspect of the present disclosure provides a semiconductor device including a first base die; a first stacked die positioned on a front surface of the first base die; and a re-fill layer completely covering the stacked die and positioned on the front surface of the first base die. The re-fill layer includes silicon oxide, silicon nitride, silicon oxynitride, silicon nitride oxide, titanium oxide, aluminum oxide, or hafnium oxide.

In some embodiments, the chip stack further includes a first molding layer completely covering the re-fill layer.

Another aspect of the present disclosure provides a method for fabricating a semiconductor device including providing a base wafer including a scribing portion; bonding a first stacked die and a second stacked die onto a front surface of the base wafer through a hybrid bonding process, wherein the first stacked die and the second stacked die are opposite to each with the scribing portion interposed therebetween; conformally forming a re-fill layer to cover the first stacked die and the second stacked die; forming a first molding layer to cover the re-fill layer and configure an intermediate semiconductor device including the base wafer, the first stacked die, the second stacked die, the re-fill layer, and the first molding layer; and dicing the intermediate semiconductor device along the scribing portion to separate the first stacked die and the second stacked die, the re-fill layer, the first molding layer, and the base wafer, wherein the base wafer are separated into a first base die and a second base die after dicing. The first base die, the first stacked die, the re-fill layer, and the first molding layer together configure a first chip stack.

In some embodiments, the re-fill layer includes silicon oxide, silicon nitride, silicon oxynitride, silicon nitride oxide, titanium oxide, aluminum oxide, or hafnium oxide.

In some embodiments, a process pressure of the hybrid bonding process is between about 100 MPa and about 150 MPa.

In some embodiments, a process temperature of the hybrid bonding process is between about 25° C. and about 400° C.

In some embodiments, the first stacked die and the base wafer are bonded in a face-to-face configuration.

In some embodiments, the method for fabricating the semiconductor device includes performing a surface treatment on the front surface of the base wafer prior to bonding the first stacked die and a second stacked die onto the front surface of the base wafer through the hybrid bonding process. The surface treatment includes a wet chemical cleaning or a vapor-phase thermal treatment.

In some embodiments, the method for fabricating the semiconductor device includes bonding the chip stack onto a package substrate.

Due to the design of the semiconductor device of the present disclosure, the re-fill layer may compensate the hardness difference and fill the cracks and seams of the stacked die. As a result, the adverse effect during dicing may be reduced or avoided. In other hands, the dicing process do not need to be over-optimized so that the cost and process complexity of fabrication of the semiconductor device may be also reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
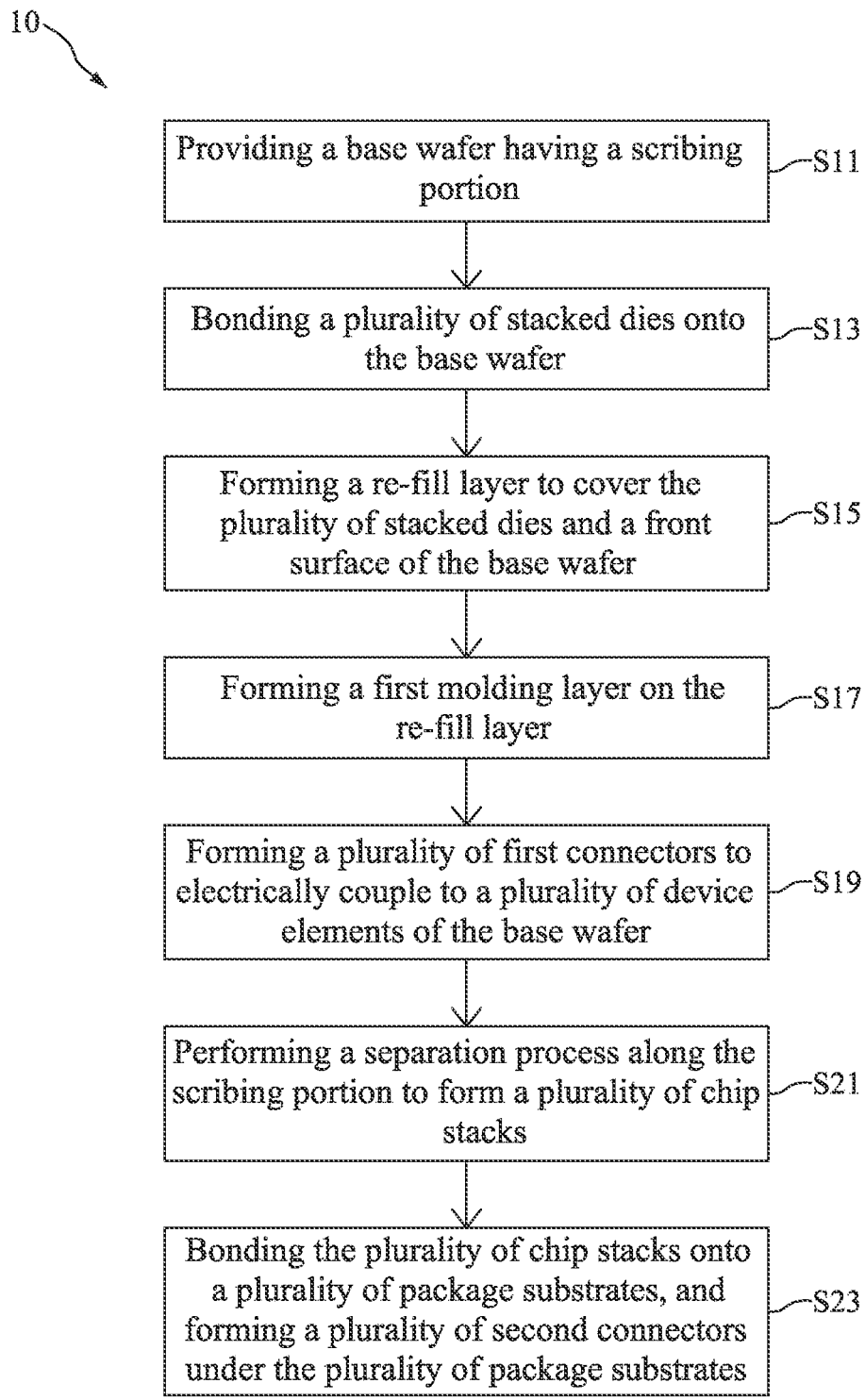
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 14 illustrate, in schematic cross-sectional view diagrams, a flow for fabricating the semiconductor device 1A in accordance with one embodiment of the present disclosure.

Figure 2:
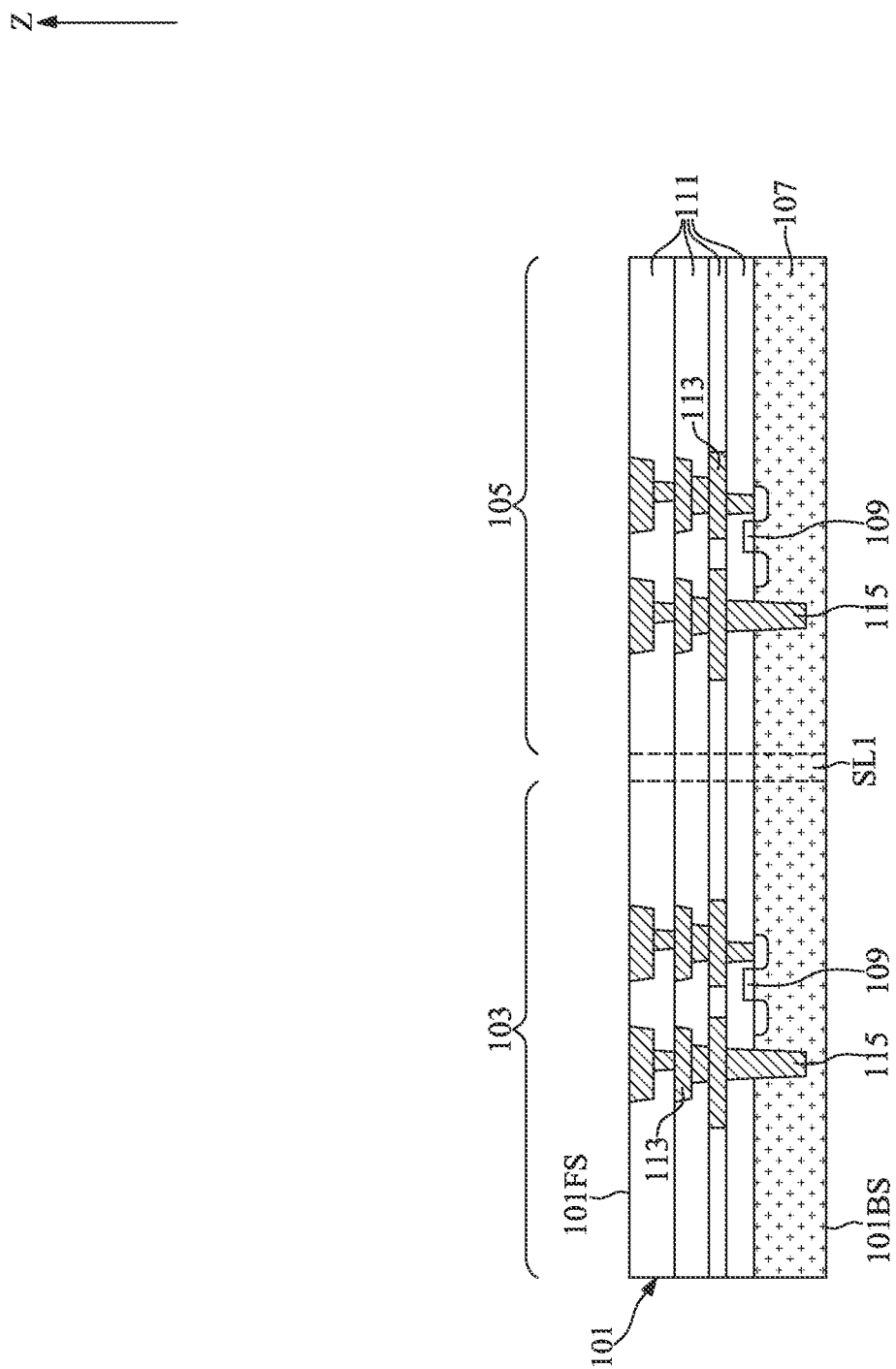
FIGS. 2 to 14 illustrate, in schematic cross-sectional view diagrams, a flow for fabricating the semiconductor device in accordance with one embodiment of the present disclosure.

With reference to FIGS. 1 and 2, at step S11, a base wafer 101 having a scribing portion SL1 may be provided.

With reference to FIG. 2, the base wafer 101 may include a substrate 107, a plurality of device elements 109, a plurality of dielectric layers 111, a plurality of conductive features 113, and a plurality of through substrate vias 115.

With reference to FIG. 2, in some embodiments, the substrate 107 may be a bulk semiconductor substrate that is composed entirely of at least one semiconductor material; the bulk semiconductor substrate does not contain any dielectrics, insulating layers, or conductive features. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 107 may include a semiconductor-on-insulator structure which consisting of, from bottom to top, a handle substrate, an insulator layer, and a topmost semiconductor material layer. The handle substrate and the topmost semiconductor material layer may be formed of a same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements 109 may be formed on the substrate 107. Some portions of the plurality of device elements 109 may be formed in the substrate 107. The plurality of device elements 109 may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers 111 may be formed on the substrate 107 and cover the plurality of device elements 109. In some embodiments, the plurality of dielectric layers 111 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers 111 may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features 113 may include interconnect layers, conductive vias, and conductive pads. The interconnect layers may be separated from each other and may be horizontally disposed in the plurality of dielectric layers 111 along the direction Z. In the present embodiment, the topmost interconnect layers may be designated as the conductive pads. The conductive vias may connect adjacent interconnect layers along the direction Z, adjacent device element 109 and interconnect layer, and adjacent conductive pad and interconnect layer. In some embodiments, the conductive vias may improve heat dissipation and may provide structure support. In some embodiments, the plurality of conductive features 113 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features 113 may be formed during the formation of the plurality of dielectric layers 111.

With reference to FIG. 2, the plurality of through substrate vias 115 may be formed in the substrate 107, extending to the dielectric layers 111, and electrically connecting to the corresponding conductive features 113.

It should be noted that, in the description of the present disclosure, the number of the device elements 109, the dielectric layers 111, the conductive features 113, and the through substrate vias 115 are just for illustration purpose. The number of aforementioned features may be more or less than that shown in FIG. 2.

In some embodiments, the plurality of device elements 109, the plurality of conductive features 113, and the plurality of through substrate vias 115 may together configure functional units of the base wafer 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the base wafer 101 may include a front surface 101FS and a back surface 101BS opposite to each other. It should be noted that, in the description of the present disclosure, the term "front" surface is a term of art implying the major surface of the structure upon which is formed device elements and conductive features. Likewise, the "back" surface of a structure is that major surface opposite to the face. In the present embodiment, the front surface 101FS of the base wafer 101 may be the top surface of the topmost dielectric layer 111. The back surface 101BS of the base wafer 101 may be the bottom surface of the substrate 107.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

With reference to FIG. 2, a middle region, which along the direction Z, of the base wafer 101 may be referred to as the scribing portion SL1. The scribing portion SL1 may divide the base wafer 101 into a left region and a right region. The left region of the base wafer 101 may be referred to as a first base die 103 and the right region of the base wafer 101 may be referred to as a second base die 105 after a dicing process, which will be illustrated later, along the scribing portion SL1. In some embodiments, the scribing portion SL1 may have a width between about 110 μm and about 220 μm.

With reference to FIG. 1 and FIGS. 3 to 8, at step S13, a plurality of stacked dies SD1, SD2, SD3, SD4, SD5, SD6 may be bonded on to the base wafer 101.

Figure 3:
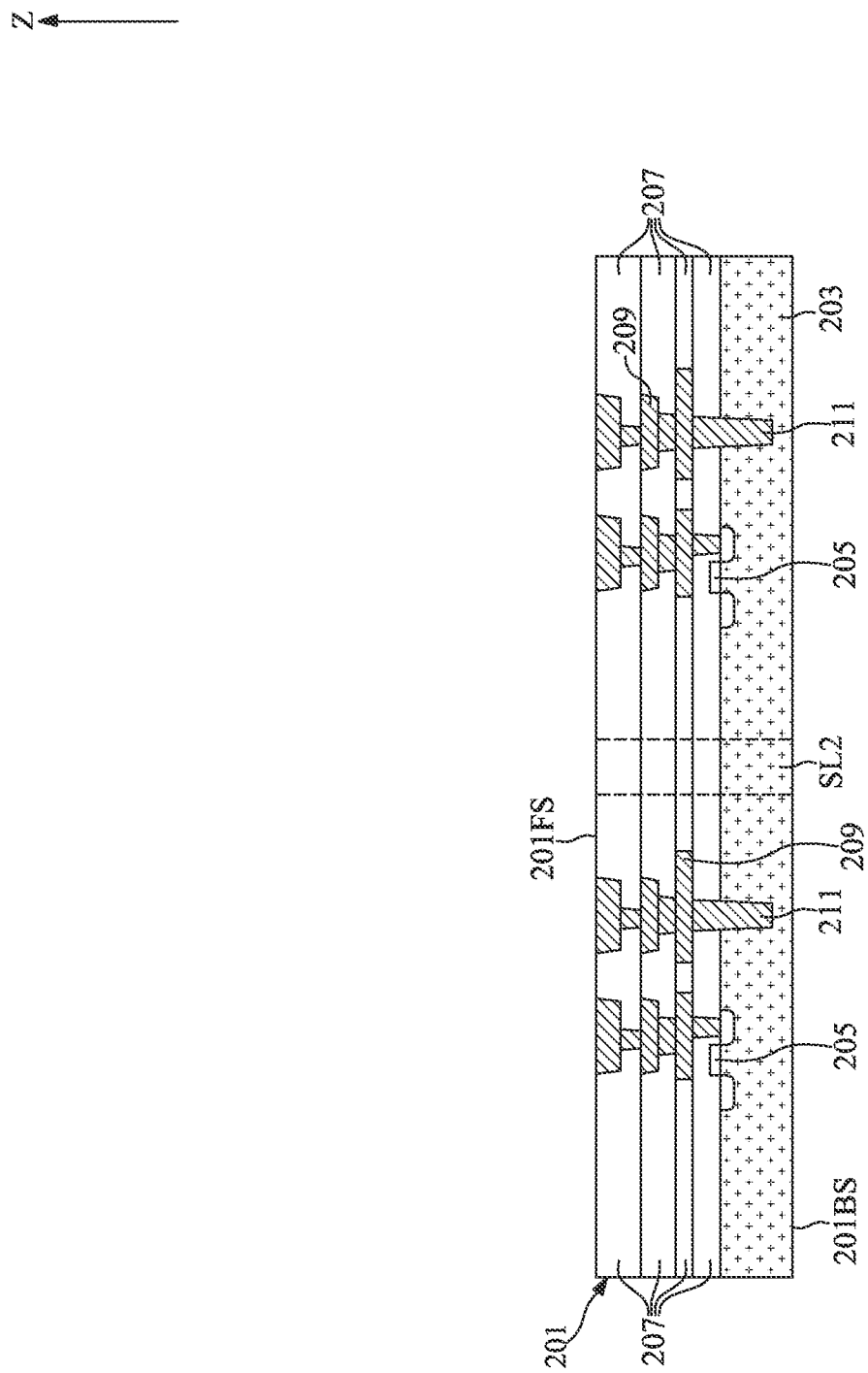

With reference to FIG. 3, a stacking wafer 201 may be provided. In some embodiments, the stacking wafer 201 may have a similar structure as the base wafer 101 but is not limited thereto. In some embodiments, the stacking wafer 201 may include a substrate 203, a plurality of device elements 205, a plurality of dielectric layers 207, a plurality of conductive features 209, and a plurality of through substrate vias 211.

With reference to FIG. 3, in some embodiments, the substrate 203 may be a bulk semiconductor substrate that is composed entirely of at least one semiconductor material; the bulk semiconductor substrate does not contain any dielectrics, insulating layers, or conductive features. The bulk semiconductor substrate may be formed as the same as that illustrated for the substrate 107, and descriptions thereof are not repeated herein. In some embodiments, the substrate 203 may include a semiconductor-on-insulator structure as the same as that illustrated for the substrate 107, and descriptions thereof are not repeated herein.

With reference to FIG. 3, the plurality of device elements 205 may be formed on the substrate 203. Some portions of the plurality of device elements 205 may be formed in the substrate 203. The plurality of device elements 205 may be transistors such as complementary metal-oxide-semiconductor transistors, metal-oxide-semiconductor field-effect transistors, fin field-effect-transistors, the like, or a combination thereof.

With reference to FIG. 3, the plurality of dielectric layers 207 may be formed on the substrate 203 and cover the plurality of device elements 205. In some embodiments, the plurality of dielectric layers 207 may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers 207 may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 3, the plurality of conductive features 209 may include interconnect layers, conductive vias, and conductive pads. The interconnect layers may be separated from each other and may be horizontally disposed in the plurality of dielectric layers 207 along the direction Z. In the present embodiment, the topmost interconnect layers may be designated as the conductive pads. The conductive vias may connect adjacent interconnect layers along the direction Z, adjacent device element 205 and interconnect layer, and adjacent conductive pad and interconnect layer. In some embodiments, the conductive vias may improve heat dissipation and may provide structure support. In some embodiments, the plurality of conductive features 209 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features 209 may be formed during the formation of the plurality of dielectric layers 207.

With reference to FIG. 3, the plurality of through substrate vias 211 may be formed in the substrate 203, extending to the dielectric layers 207, and electrically connecting to the corresponding conductive features 209.

It should be noted that, in the description of the present disclosure, the number of the device elements 205, the dielectric layers 207, the conductive features 209, and the through substrate vias 211 are just for illustration purpose. The number of aforementioned features may be more or less than that shown in FIG. 3.

With reference to FIG. 3, the stacking wafer 201 may include a front surface 201FS and a back surface 201BS opposite to each other. In the present embodiment, the front surface 201FS of the stacking wafer 201 may be the top surface of the topmost dielectric layer 207. The back surface 201BS of the stacking wafer 201 may be the bottom surface of the substrate 203.

In some embodiments, the plurality of device elements 205, the plurality of conductive features 209, and the plurality of through substrate vias 211 may together configure functional units of the stacking wafer 201.

Figure 6:
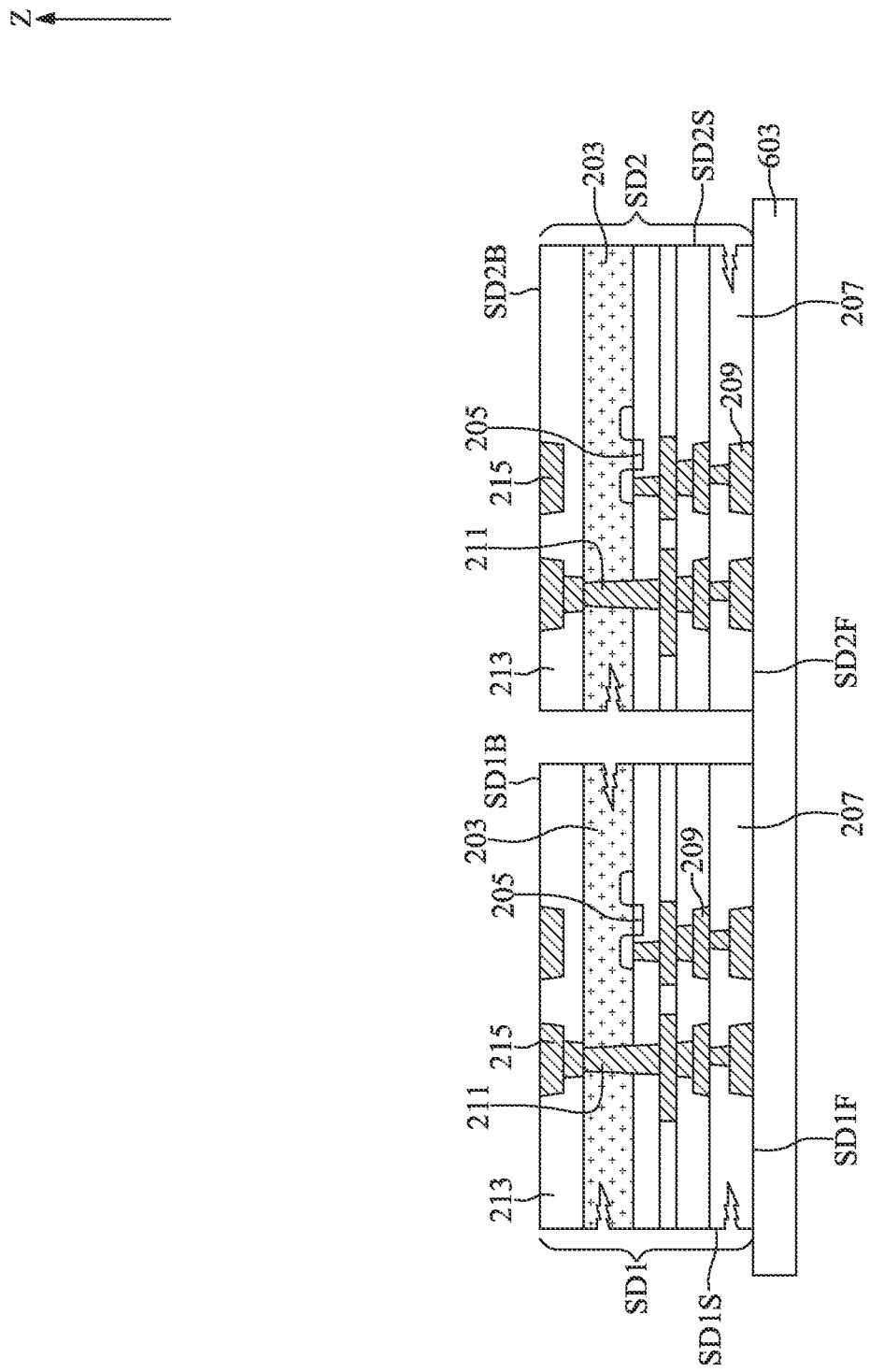

With reference to FIG. 3, a middle region, which along the direction Z, of the stacking wafer 201 may be referred to as a scribing portion SL2. The scribing portion SL2 may divide the stacking wafer 201 into a left region and a right region. The left region of the stacking wafer 201 may be referred to as a stacked die SD1 (as shown in FIG. 6 later) and the right region of the stacking wafer 201 may be referred to as a stacked die SD2 (as shown in FIG. 6 later) after a dicing process, which will be illustrated later, along the scribing portion SL2. In some embodiments, the scribing portion SL2 may have a width between about 110 μm and about 220 μm.

Figure 4:
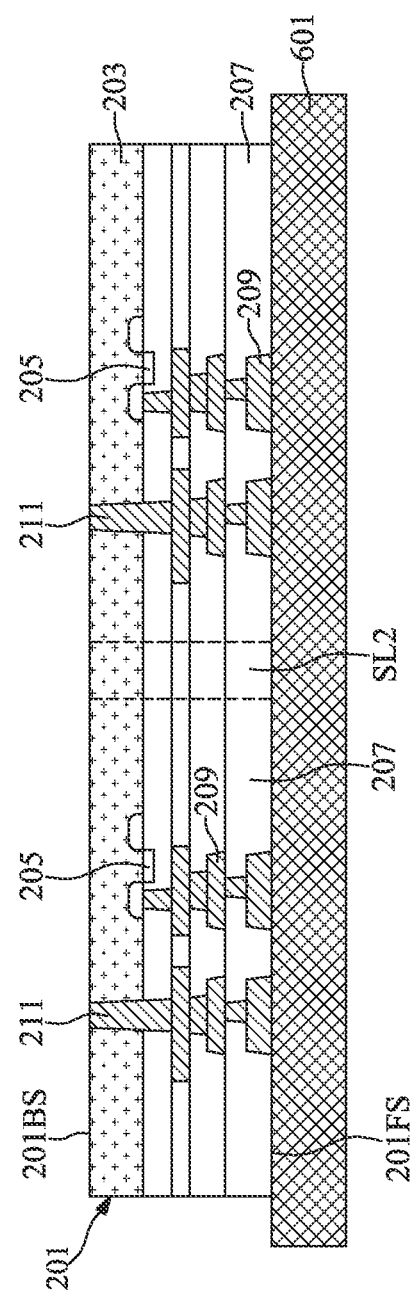

With reference to FIG. 4, the stacking wafer 201 may be flipped and the front surface 201FS of the stacking wafer 201 may be temporarily bonded on a carrier layer 601. The back surface 201BS of the stacking wafer 201 may be faced upwardly in the current stage.

Figure 5:
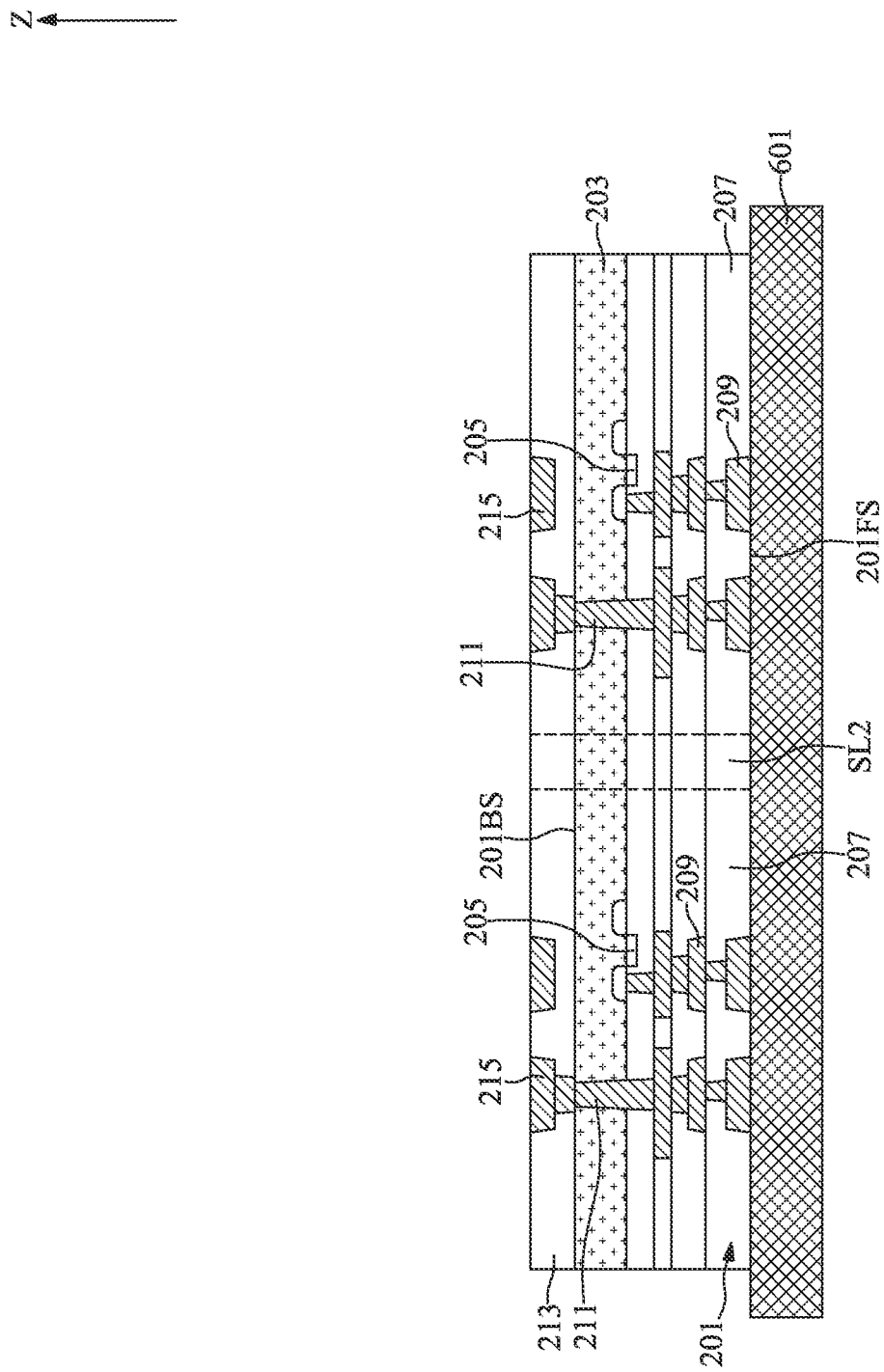

With reference to FIG. 5, a passivation layer 213 may be formed on the back surface 201BS of the stacking wafer 201. In some embodiments, the passivation layer 213 may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In addition, some photosensitive polymeric material (e.g., photosensitive polyimide) may have all aforementioned characteristics and may be patterned like a photoresist mask and may, after patterning and etching, remain on the surface on which the photosensitive polymeric material has been deposited to serve as part of a passivation layer.

In some embodiments, the passivation layer 213 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 5, a plurality of bonding pads 215 may be formed in the passivation layer 213 and may be electrically coupled to the corresponding through substrate vias 211. In some embodiments, pad openings (not shown in FIG. 5) may be formed in the passivation layer 213 and a conductive material may be formed to fill the pad openings to form the plurality of bonding pads 215. The pad opening may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 seconds and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, the pad openings may be sequentially filled with the conductive material by sputtering or electroless plating. For example, when the pad opening are filled by sputtering using an aluminum-copper material as source, the process temperature of sputtering may be between about 100° C. and about 400° C. The process pressure of sputtering may be between about 1 mTorr and about 100 mTorr. For another example, the pad openings may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

With reference to FIG. 6, a separation process may be performed to dice the stacking wafer 201 along the scribing portion SL2. The separation process may be performed by a laser cutter or a saw blade. After the separation process, the stacking wafer 201 may be divided into the stacked die SD1 and the stacked die SD2. The stacked die SD1 may include a front surface SD1F and a back surface SD1B opposite to each other. In the FIG. 6, the front surface SD1F of the stacked die SD1 is the top surface of the passivation layer 213 and the back surface SD1B of the stacked die SD1 is the bottom surface of the bottommost dielectric layer 207. Accordingly, the stacked die SD2 may include a front surface SD2F and a back surface SD2B opposite to each other. The plurality of stacked dies SD1, SD2 may be transferred from the carrier layer 601 to a die frame 603. It should be noted that, after the separation process, small cracks and seams may be occur on the sidewalls SD1S, SD2S of the stacked die SD1 and the stacked die SD2.

Figure 7:
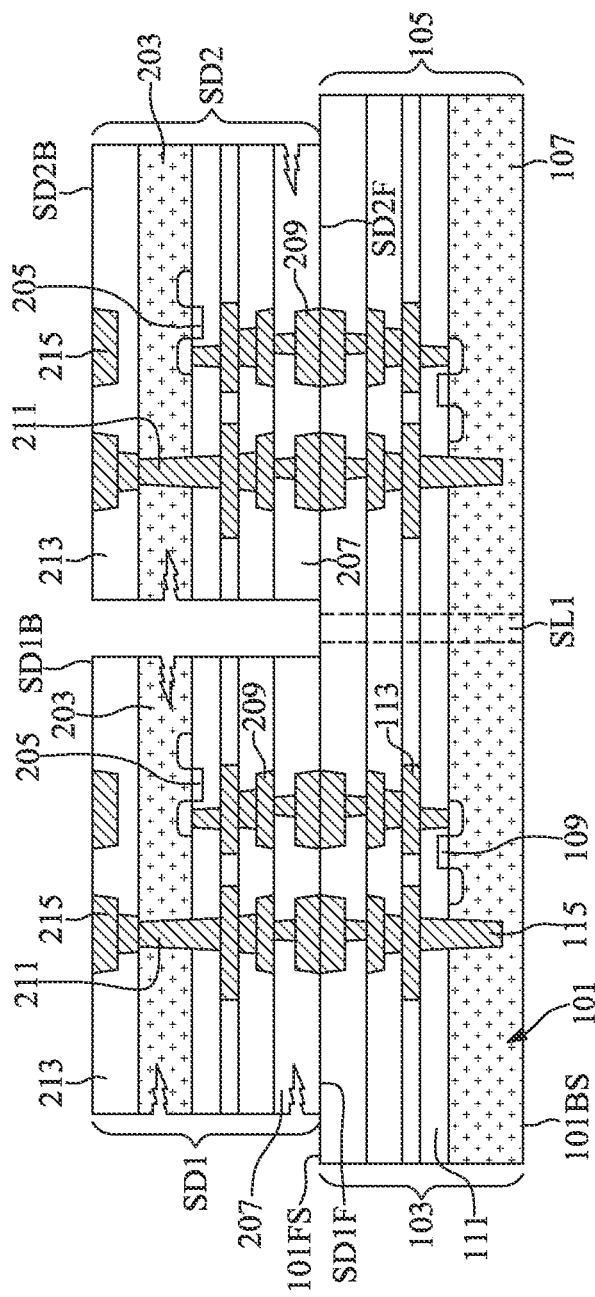

With reference to FIG. 7, the stacked die SD1 and the stacked die SD2 may be sequentially bonded onto the base wafer 101. The stacked die SD1 may be bonded onto the base wafer 101 in a face-to-face configuration through a hybrid bonding process. The front surface SD1F of the stacked die SD1 may be bonded onto the front surface 101FS of the base wafer 101. In some embodiments, the hybrid bonding process may be, for example, thermo-compression bonding, passivation-capping-layer assisted bonding, or surface activated bonding. For example, the hybrid bonding process may include activating exposed surfaces of the bottommost dielectric layer 207 of the stacked die SD1 and the topmost dielectric layer 111 (e.g., in a plasma process), cleaning the dielectric layers 111, 207 after activation, contacting the activated surface of the second bonding layer 213 and the activated surface of the upper dielectric layer 503, and performing a thermal annealing process to strengthen the bonding between the second bonding layer 213 and the upper dielectric layer 503.

In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to shorten the time consuming of the hybrid bonding process.

In some embodiments, the hybrid bonding process may include dielectric-to-dielectric bonding, metal-to-metal bonding, and metal-to-dielectric bonding. The dielectric-to-dielectric bonding may originate from the bonding between the bottommost dielectric layer 207 of the stacked die SD1 and the topmost dielectric layer 111 of the base wafer 101. The metal-to-metal bonding may originate from the bonding between the conductive pads of the stacked die SD1 and the conductive pads of the base wafer 101. The metal-to-dielectric bonding may originate from the bonding between the bottommost dielectric layer 207 of the stacked die SD1 and the conductive pads of the base wafer 101, and between the topmost dielectric layer 111 of the base wafer 101 and the conductive pads of the stacked die SD1.

In some embodiments, when the bottommost dielectric layer 207 of the stacked die SD1 and the topmost dielectric layer 111 of the base wafer 101 are formed of, for example, silicon oxide or silicon nitride, the bonding between the dielectric layers 111, 207 may be based on the hydrophilic bonding mechanism. Hydrophilic surface modifications may be applied to the dielectric layers 111, 207 before bonding.

In some embodiments, when the bottommost dielectric layer 207 of the stacked die SD1 and the topmost dielectric layer 111 of the base wafer 101 are formed of polymer adhesives such as polyimide, benzocyclobutenes, and polybenzoxazole, the bonding between the dielectric layers 111, 207 may be based on thermo-compression bonding.

In some embodiments, a thermal annealing process may be performed after the bonding process to enhance dielectric-to-dielectric bonding and to induce thermal expansion of metal-to-metal bonding so as to further improve the bonding quality.

With reference to FIG. 7, the stacked die SD2 may be bonded onto the base wafer 101 with a procedure similar to the stacked die SD1, and descriptions thereof are not repeated herein. In the present embodiment, the stacked die SD1 is boned onto the left region of the base wafer 101. The stacked die SD2 is bonded onto the right region of the base wafer 101 and is distant from the stacked die SD1.

Figure 8:
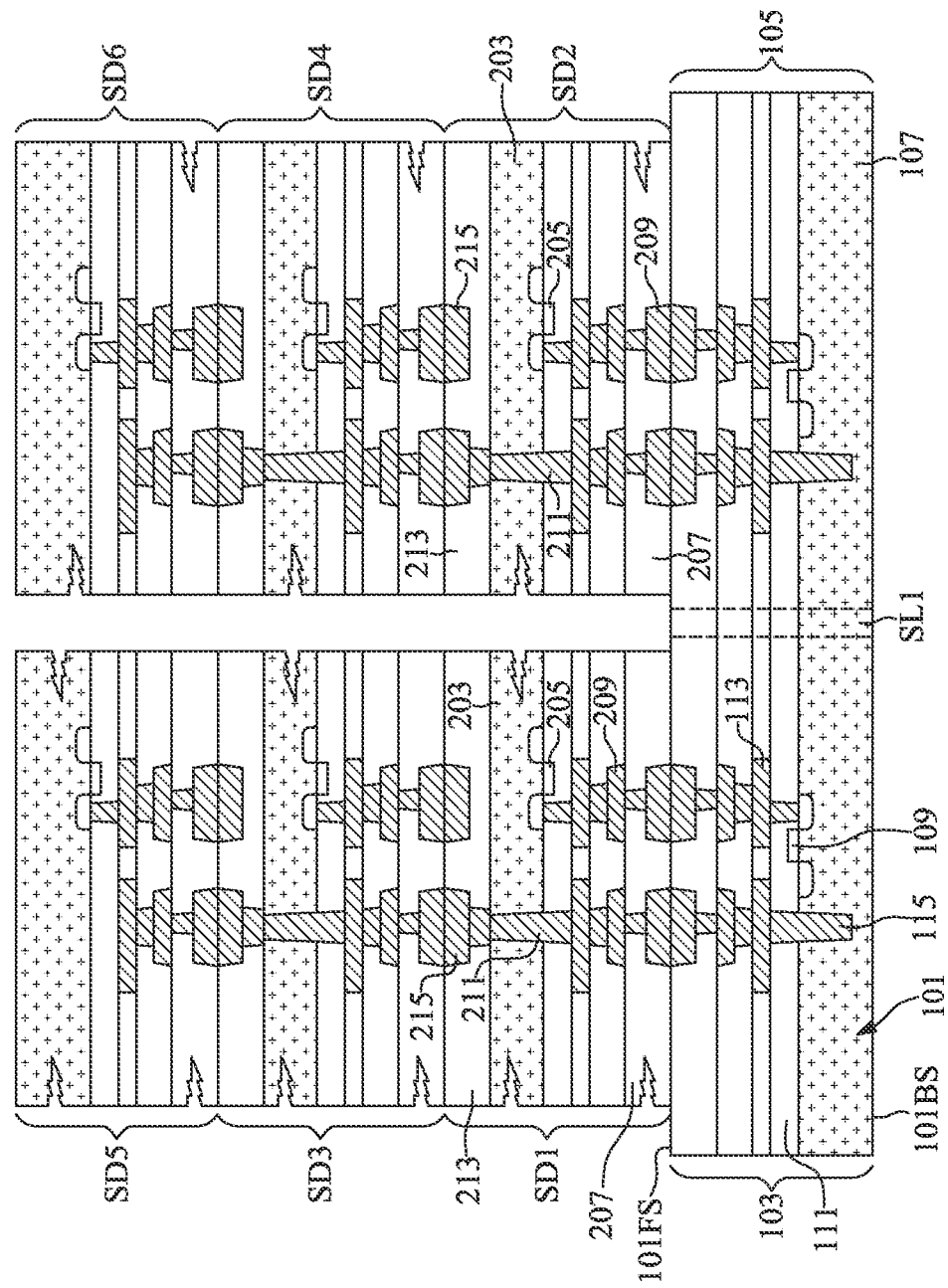

With reference to FIG. 8, the stacked dies SD3, SD4, SD5, SD6 may be provided with a procedure similar to the stacked dies SD1, SD2, and descriptions thereof are not repeated herein. The stacked die SD3 may be bonded onto the stacked die SD1 and the stacked die SD4 may be bonded onto the stacked die SD2, respectively and correspondingly, through hybrid bonding process similar to that illustrated in FIG. 7, and descriptions thereof are not repeated herein. In some embodiments, the stacked die SD3 and the stacked die SD1 may be bonded in a face-to-back configuration. In some embodiments, the stacked die SD3 and the stacked die SD1 may be bonded in a back-to-back configuration. In some embodiments, a redistribution layer may be formed between the stacked die SD3 and the stacked die SD1 to electrically couple the conductive features of the stacked die SD3 and the stacked die SD1. The stacked dies SD4, SD5, SD6 may be bonded with a procedure similar to the stacked die SD3, and descriptions thereof are not repeated herein. In the present embodiment, the topmost stacked dies SD5, SD6 may not include the through substrate vias.

In some embodiments, the stacked die SD1 and the stacked die SD3 may have the same layout and may include the same functional units. In some embodiments, the stacked die SD1 and the stacked die SD3 may have different layouts and may include different functional units.

It should be noted that, in the description of the present disclosure, the number of the stacked dies is just for illustration purpose. The number of stacked dies may be more or less than that shown in FIG. 8.

Figure 9:
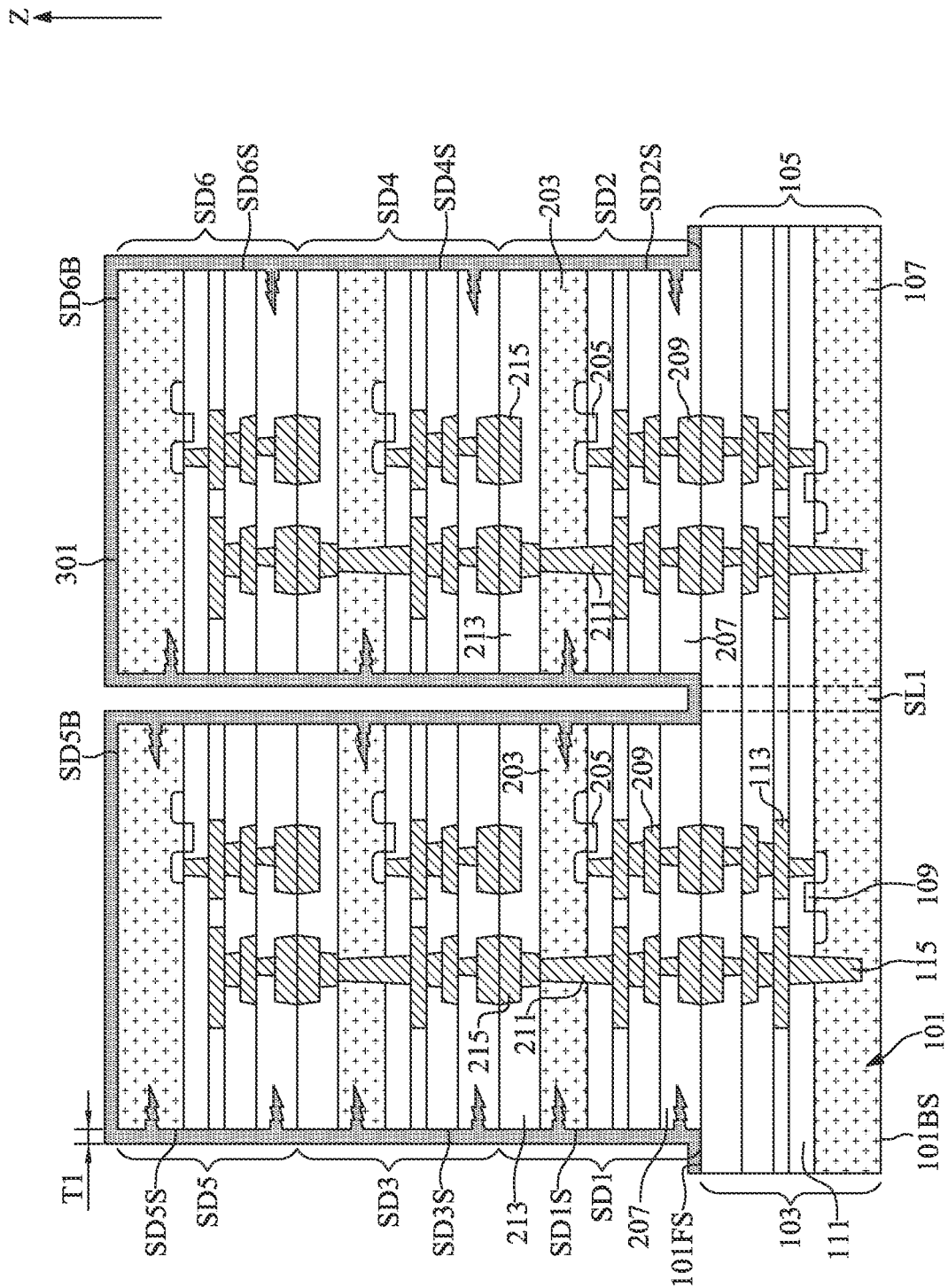

With reference to FIGS. 1 and 9, at step S15, a re-fill layer 301 may be conformally formed to cover the plurality of stacked dies SD1, SD2, SD3, SD4, SD5, SD6 and the front surface 101FS of the base wafer 101.

With reference to FIG. 9, the re-fill layer 301 may be conformally formed on the front surface 101FS of the base wafer 101, the sidewalls SD1S, SD2S, SD3S, SD4S, SD5S, SD6S of the plurality of stacked dies SD1, SD2, SD3, SD4, SD5, SD6, and the back surfaces SD5B, SD6B of the plurality of stacked dies SD5, SD6. The small cracks and seams of the plurality of stacked dies SD1, SD2, SD3, SD4, SD5, SD6 formed during dicing may be filled by the re-fill layer 301. In some embodiments, the thickness T1 of the re-fill layer 301 may be between about 50 angstroms and about 1000 angstroms. In some embodiments, the re-fill layer 301 may be formed of, for example, silicon oxide, silicon nitride, silicon oxynitride, silicon nitride oxide, titanium oxide, aluminum oxide, hafnium oxide, or a combination thereof. In some embodiments, the re-fill layer 301 may be formed by, for example, atomic layer deposition.

Generally, the atomic layer deposition is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an adsorbed layer of one reactant leaves a surface termination that is non-reactive with the gas phase reactants of the same reactant. The substrate is subsequently contacted with a different reactant that reacts with the previous termination to enable continued deposition. Thus, each cycle of alternated pulses typically leaves no more than about one monolayer of the desired material. However, in one or more cycles of the atomic layer deposition, more than one monolayer of material may be deposited.

In the present embodiment, the re-fill layer 301 may be formed of silicon nitride and may be formed by atomic layer deposition. For example, the substrate surface (e.g., the front surface 101FS of the base wafer 101, the sidewalls SD1S, SD2S, SD3S, SD4S, SD5S, SD6S of the plurality of stacked dies SD1, SD2, SD3, SD4, SD5, SD6, and the back surfaces SD5B, SD6B of the plurality of stacked dies SD5, SD6) on which deposition is desired is contacted with a first vapor phase reactant including a silicon precursor which chemisorbs onto the substrate surface, forming no more than about one monolayer of reactant species on the substrate surface. In some embodiments, each contacting step may be repeated one or more times prior to advancing on to the subsequent processing step, i.e., prior to a subsequent contacting step or removal/purge step.

In some embodiments, a silicon precursor may include a silicon halide source. In some embodiments, the first vapor phase reactant may include a silicon halide source and may further include at least one of silicon tetraiodide, silicon tetrabromide, silicon tetrachloride, hexachlorodisilane, hexaiododisilane, and octoiodotrisilane. In some embodiments, the silicon halide source may be preheated to provide sufficient vapor pressure for delivery. For example, the silicon halide source may be preheated to a temperature of between about 90° C. and about 125° C., or about 100° C.

In some embodiments, contacting (or exposing) the substrate surface to a silicon halide source may include pulsing the silicon precursor over the substrate surface for a time period of between about 0.5 seconds and about 30 seconds, or between about 0.5 seconds and about 10.0 seconds, or between about 0.5 seconds and about 5.0 seconds. In addition, during the pulsing duration, the flow rate of the silicon halide source may be less than 2000 sccm, or less than 1000 sccm, or less than 500 sccm, or less than 250 sccm or even less than 100 sccm.

Excess silicon halide source and reaction byproducts (if any) may be removed from the substrate surface, e.g., by purging with an inert gas. In some embodiments, the atomic layer deposition may include a purge cycle wherein the substrate surface is purged for a time period of less than about 5.0 seconds. Excess silicon halide source and any reaction byproducts may be removed with the aid of a vacuum generated by a pumping system.

Subsequently, the substrate surface is contacted with a second vapor phase reactant including a nitrogen source. In some embodiments, the second vapor phase reactant may include at least one of ammonia, hydrazine, or an alkyl-hydrazine. The alkyl-hydrazine may refer to a derivative of hydrazine which may include an alkyl functional group and may also include additional functional groups, non-limiting example embodiments of an alkyl-hydrazine may include tertbutylhydrazine, methylhydrazine, or dimethylhydrazine.

In some embodiments, contacting (or exposing) the substrate surface to the nitrogen source may include pulsing the nitrogen source over the substrate surface for a time period of between about 0.5 seconds to about 30.0 seconds, or between about 0.5 seconds to about 10 seconds, or between about 0.5 second to about 5 seconds. During the pulsing duration, the flow rate of the nitrogen source may be less than 4000 sccm, or less than 2000 sccm, or less than 1000 sccm, or even less than 250 sccm.

Excess second vapor phase reactant and reaction byproducts, if any, may be removed from the substrate surface, for example by a purging gas pulse and/or vacuum generated by a pumping system. Purging gas is preferably any inert gas, such as, without limitation, argon, nitrogen, or helium.

In some embodiments, the atomic layer deposition may be performed at a reaction chamber pressure of less than about 50 Torr, or at a reaction chamber pressure of less than about 25 Torr, or at a reaction chamber pressure of less than about 10 Torr, or even at a reaction chamber pressure of less than about 5 Torr.

In some embodiments, once the re-fill layer 301 is deposited, the re-fill layer 301 may be exposed to a plasma in order to improve the materials characteristics of the re-fill layer 301. In some embodiments, the plasma may be configured with a capacitively coupled plasma source, an inductively coupled plasma source or a remote plasma source. In some embodiments, the source gas from which the plasma is generated may include one or more of nitrogen, helium, hydrogen, and argon. In some embodiments, the power to energize the plasma source gas may be greater than about 150 W, or greater than about 300 W, or greater than about 600 W, or even greater than about 900 W. In some embodiments, the pressure for exposing the re-fill layer 301 to the plasma may be less than about 4 Torr, less about 2 Torr, or may even less than about 1 Torr. In some embodiments, the duration of exposing the re-fill layer 301 to the plasma may be less than less than about 300 seconds, less than about 150 seconds, or even less than about 90 seconds.

Figure 10:
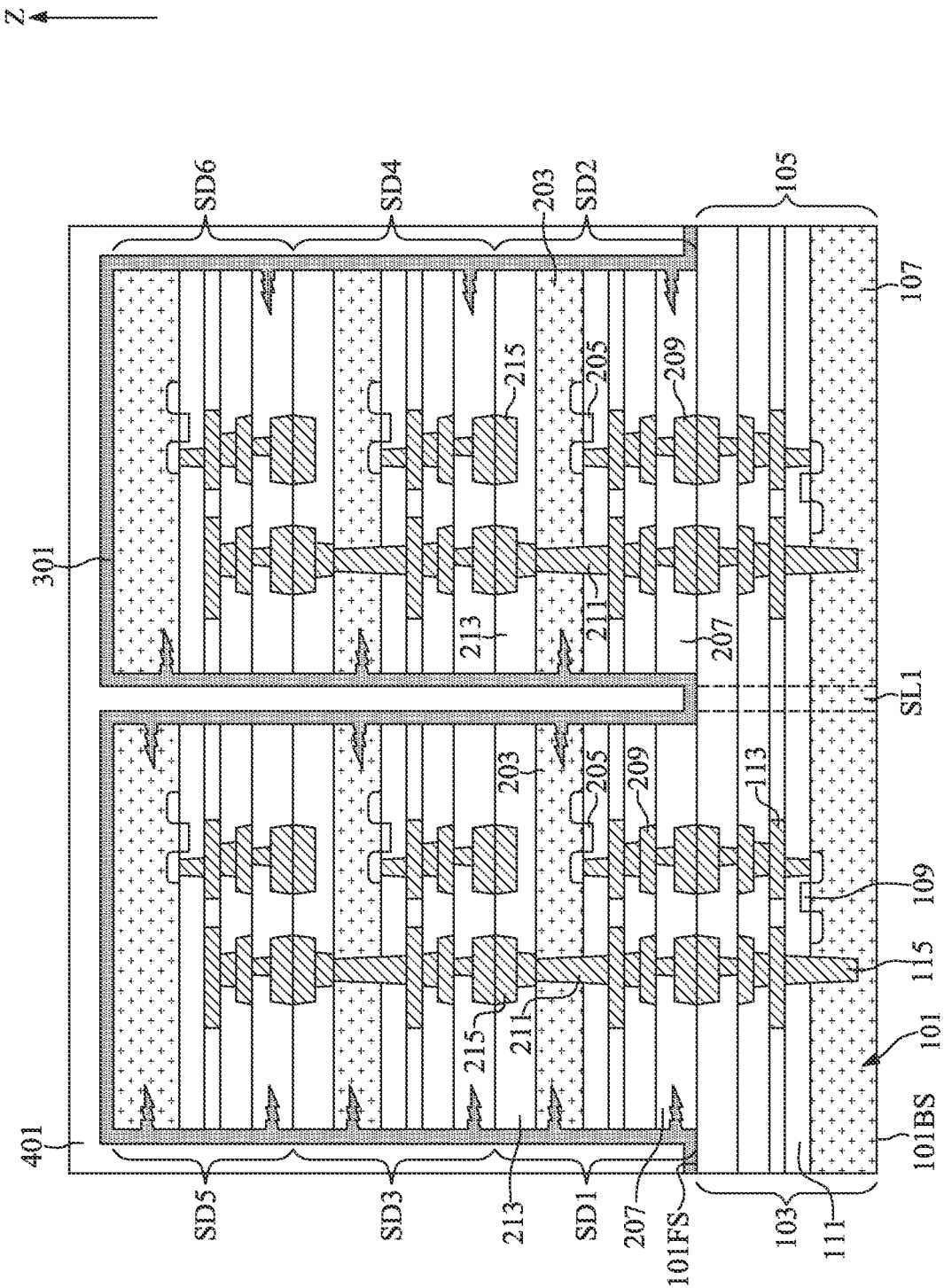
Figure 11:
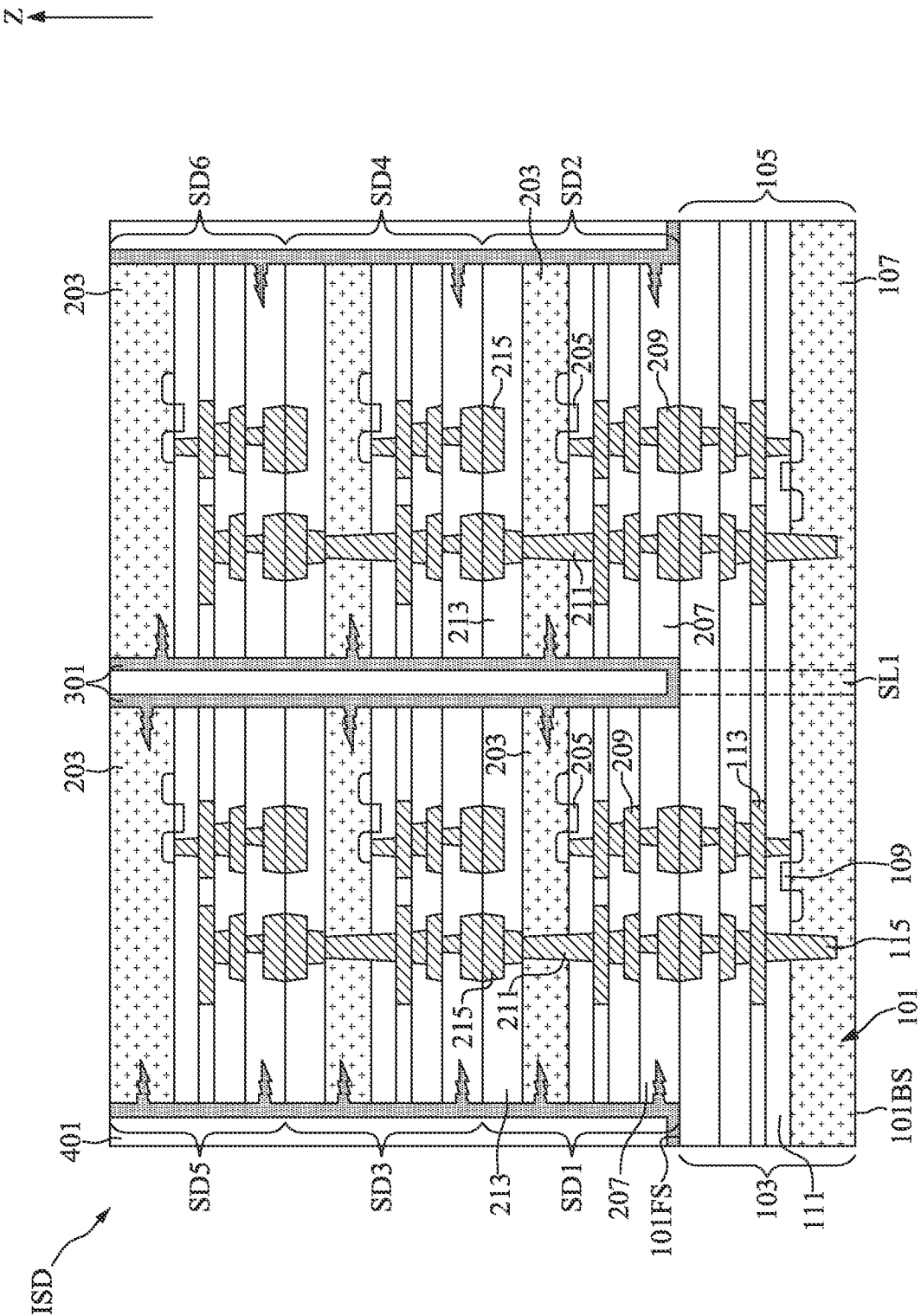

With reference to FIGS. 1, 10, and 11, at step S17, a first molding layer 401 may be formed on the re-fill layer 301.

With reference to FIG. 10, the first molding layer 401 may be formed on the re-fill layer 301 to completely cover the re-fill layer 301, the front surface 101FS of the base wafer 101, and the plurality of stacked dies SD1, SD2, SD3, SD4, SD5, SD6. It should be noted that, the gap between the stacked dies SD1, SD3, SD5 and the stack dies SD2, SD4, SD6 may be completely filled by the first molding layer 401. In some embodiments, the first molding layer 401 may be formed of a molding compound such as polybenzoxazole, polyimide, benzocyclobutene, epoxy laminate, or ammonium bifluoride. The first molding layer 401 may be formed by compressive molding, transfer molding, liquid encapsulant molding, and the like. For example, a molding compound may be dispensed in liquid form. Subsequently, a curing process is performed to solidify the molding compound. The formation of molding compound may overflow the intermediate semiconductor device illustrated in FIG. 10 so that molding compound may completely cover the re-fill layer 301 and the plurality of stacked dies SD1, SD2, SD3, SD4, SD5, SD6.

With reference to FIG. 11, a thinning process may be performed to reduce a thickness of the third substrate 301 so as to reduce the height of the plurality of stacked dies SD5, SD6. This thinning process may allow for improved thermal dissipation and provide for a lower device profile. In some embodiments, the plurality of stacked dies SD5, SD6 may be thinned to a thickness between about 0.5 μm and about 10 μm. The thinning process may be accomplished, e.g., using mechanical abrasion, polishing, or the like, or using chemical removal, such as a wet etch.

In some embodiments, a thinning-stop layer (not shown) may be implanted in the substrate 203 of the plurality of stacked dies SD5, SD6 for thinning stop control. The thinning stop layer may be a dopant layer or an epitaxially grown layer having a thickness of about 0.2 μm to about 10 μm. The thickness of the thinning stop layer may be selected so that it is sufficiently thick to stop the thinning process depending on the employed etching selectivity. For example, if the used etching selectivity is about 1:100, the thinning stop layer may have a thickness between about 0.2 μm and about 5 μm. Other dimensions may be used for the thinning stop layer based on process configuration.

Figure 12:
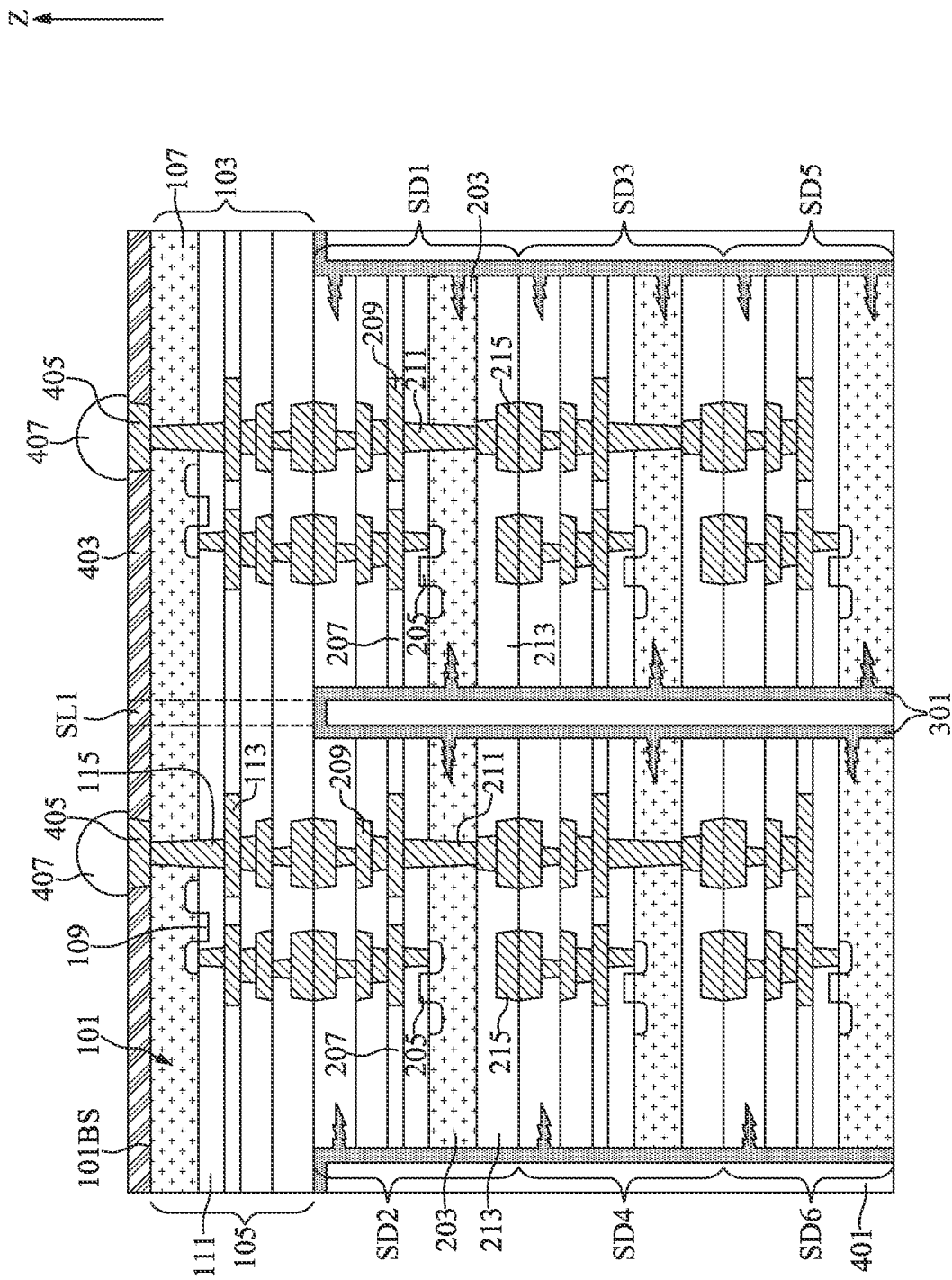

With reference to FIGS. 1 and 12, at step S19, a plurality of first connectors 407 may be formed to electrically couple to the plurality of device elements 109 of the base wafer 101.

With reference to FIG. 12, the intermediate semiconductor device ISD illustrated in FIG. 11 may be flipped. A bottom passivation layer 403 may be formed on the back surface 101BS of the base wafer 101. In some embodiments, the bottom passivation layer 403 may be formed of a polymeric material such as polybenzoxazole, polyimide, benzocyclobutene, ajinomoto buildup film, solder resist film, or the like. The polymeric material (e.g., polyimide) may have a number of attractive characteristics such as the ability to fill openings of high aspect ratio, a relatively low dielectric constant (about 3.2), a simple depositing process, the reduction of sharp features or steps in the underlying layer, and high temperature tolerance after curing. In addition, some photosensitive polymeric material (e.g., photosensitive polyimide) may have all aforementioned characteristics and may be patterned like a photoresist mask and may, after patterning and etching, remain on the surface on which the photosensitive polymeric material has been deposited to serve as part of a passivation layer.

In some embodiments, the bottom passivation layer 403 may be formed by, for example, spin-coating, lamination, deposition, or the like. The deposition may include chemical vapor deposition such as plasma-enhanced chemical vapor deposition. The process temperature of the plasma-enhanced chemical vapor deposition may be between about 350° C. and about 450° C. The process pressure of the plasma-enhanced chemical vapor deposition may be between about 2.0 Torr and about 2.8 Torr. The process duration of the plasma-enhanced chemical vapor deposition may be between about 8 seconds and about 12 seconds.

With reference to FIG. 12, a plurality of bottom bonding pads 405 may be formed in the bottom passivation layer 403 and may be electrically coupled to the corresponding through substrate vias 115. In some embodiments, pad openings (not shown in FIG. 12) may be formed in the bottom passivation layer 403 and a conductive material may be formed to fill the pad openings to form the bottom passivation layer 403. The pad opening may be formed by a photolithography process and a subsequent etching process. In some embodiments, the etching process may be an anisotropic dry etching process using argon and tetrafluoromethane as etchants. The process temperature of the etching process may be between about 120° C. and about 160° C. The process pressure of the etching process is between about 0.3 Torr and about 0.4 Torr. The process duration of the etching process may be between about 33 and about 39 seconds. Alternatively, in some embodiments, the etching process may be an anisotropic dry etching process using helium and nitrogen trifluoride as etchants. The process temperature of the etching process may be between about 80° C. and about 100° C. The process pressure of the etching process is between about 1.2 Torr and about 1.3 Torr. The process duration of the etching process may be between about 20 seconds and about 30 seconds.

In some embodiments, the pad openings may be sequentially filled with the conductive material by sputtering or electroless plating. For example, when the pad opening are filled by sputtering using an aluminum-copper material as source, the process temperature of sputtering may be between about 100° C. and about 400° C. The process pressure of sputtering may be between about 1 mTorr and about 100 mTorr. For another example, the pad openings may be filled by an electroplating process using a plating solution. The plating solution may include copper sulfate, copper methane sulfonate, copper gluconate, copper sulfamate, copper nitrate, copper phosphate, or copper chloride. The pH of the plating solution may be between about 2 and about 6 or between about 3 and about 5. The process temperature of the electroplating process may be maintained between about 40° C. and about 75° C. or between about 50° C. and about 70° C.

With reference to FIG. 12, a plurality of first connectors 407 may be formed on the bottom passivation layer 403 and on the plurality of bottom bonding pads 405. The plurality of first connectors 407 may be electrically connected to the plurality of bottom bonding pads 405, respectively and correspondingly. In some embodiments, the plurality of first connectors 407 may include a conductive material with low resistivity, such as tin, lead, silver, copper, nickel, bismuth or an alloy thereof, and may be formed by a suitable process such as evaporation, plating, or ball drop.

In some embodiments, the plurality of first connectors 407 may be solder joints. The solder joints may comprise a material such as tin, or other suitable materials, such as silver or copper. In an embodiment in which the solder joints are tin solder joints, the solder joints may be formed by initially forming a layer of tin through evaporation, electroplating, printing, solder transfer, or ball placement to a thickness of about 10 μm to about 100 μm. Once the layer of tin has been formed on the bottom passivation layer 403, a reflow process may be performed to shape the solder joints into the desired shape.

In some embodiments, the plurality of first connectors 407 may be pillar bumps formed of, for example, copper. The pillar bumps may be formed directly on the back surface 101BS of the base wafer 101, without requiring contact pads, under bump metallization, or the like, thus further reducing cost and process complexity of the semiconductor device 1A, which may allow for increased density of pillar bumps. For example, in some embodiments, a critical dimension of a pillar bump (e.g., pitch) may be less than about 5 μm, and the pillar bump may have a height less than about 10 μm. The pillar bumps may be formed using any suitable method, such as, depositing a seed layer, optionally forming an under bump metallurgy, using a mask to define a shape of the pillar bumps, electro-chemically plating the pillar bumps in the mask, and subsequently removing the mask and any undesired portions of the seed layer. The pillar bumps may be used to electrically connect the semiconductor device 1A to other package components such as, a fan-out redistribution layer, package substrates, interposers, printed circuit boards, and the like.

Figure 13:
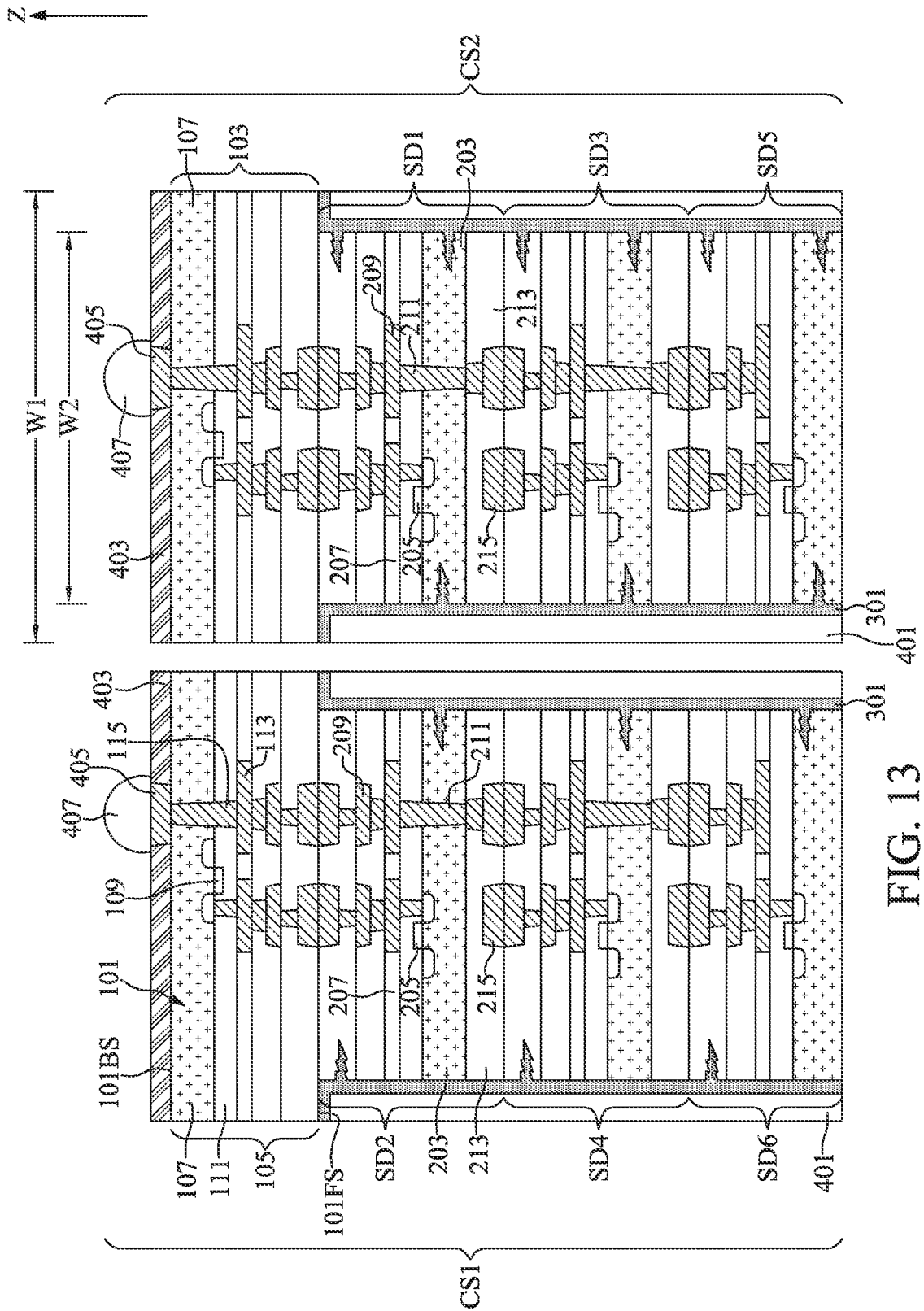

With reference to FIGS. 1 and 13, at step S21, a separation process may be performed along the scribing portion SL1 to form a plurality of chip stacks CS1, CS2.

With reference to FIG. 13, the separation process may be performed to dice the base wafer 101 along the scribing portion SL2. The first molding layer 401 filled between the gap between the stacked dies SD1, SD3, SD5 and the stack dies SD2, SD4, SD6 may also be diced during the separation process. The separation process may be performed by a laser cutter or a saw blade. After the separation process, the base wafer 101 may be divided into the first base die 103 and the second base die 105. In some embodiments, the width W1 of the first base die 103 may be greater than the width W2 of the stacked die SD1.

With reference to FIG. 13, the first base die 103, the plurality of stacked dies SD1, SD3, SD5, the remaining re-fill layer 301, and the remaining first molding layer 401 together configure the chip stack CS1. The second base die 105, the plurality of stacked dies SD2, SD4, SD6, the remaining re-fill layer 301, and the remaining first molding layer 401 together configure the chip stack CS2.

Conventionally, the separation process include dicing materials with distinct hardness (e.g., soft first molding layer 401 and hard base wafer 101) so that the process parameters may be difficult to optimize. In addition, the stress during dicing the material with greater hardness may induce the propagation of the cracks and seams of the plurality of stacked dies SD1, SD2, SD3, SD4, SD5, SD6. As a result, the structure stability and the reliability of the semiconductor device 1A may suffered.

In contrast, the re-fill layer 301 may compensate the hardness difference and fill the cracks and seams of the plurality of stacked dies SD1, SD2, SD3, SD4, SD5, SD6. As a result, the adverse effect during separation process may be reduced or avoided. In other hands, the separation process do not need to be over-optimized so that the cost and process complexity of fabrication of the semiconductor device 1A may be also reduced.

Figure 14:
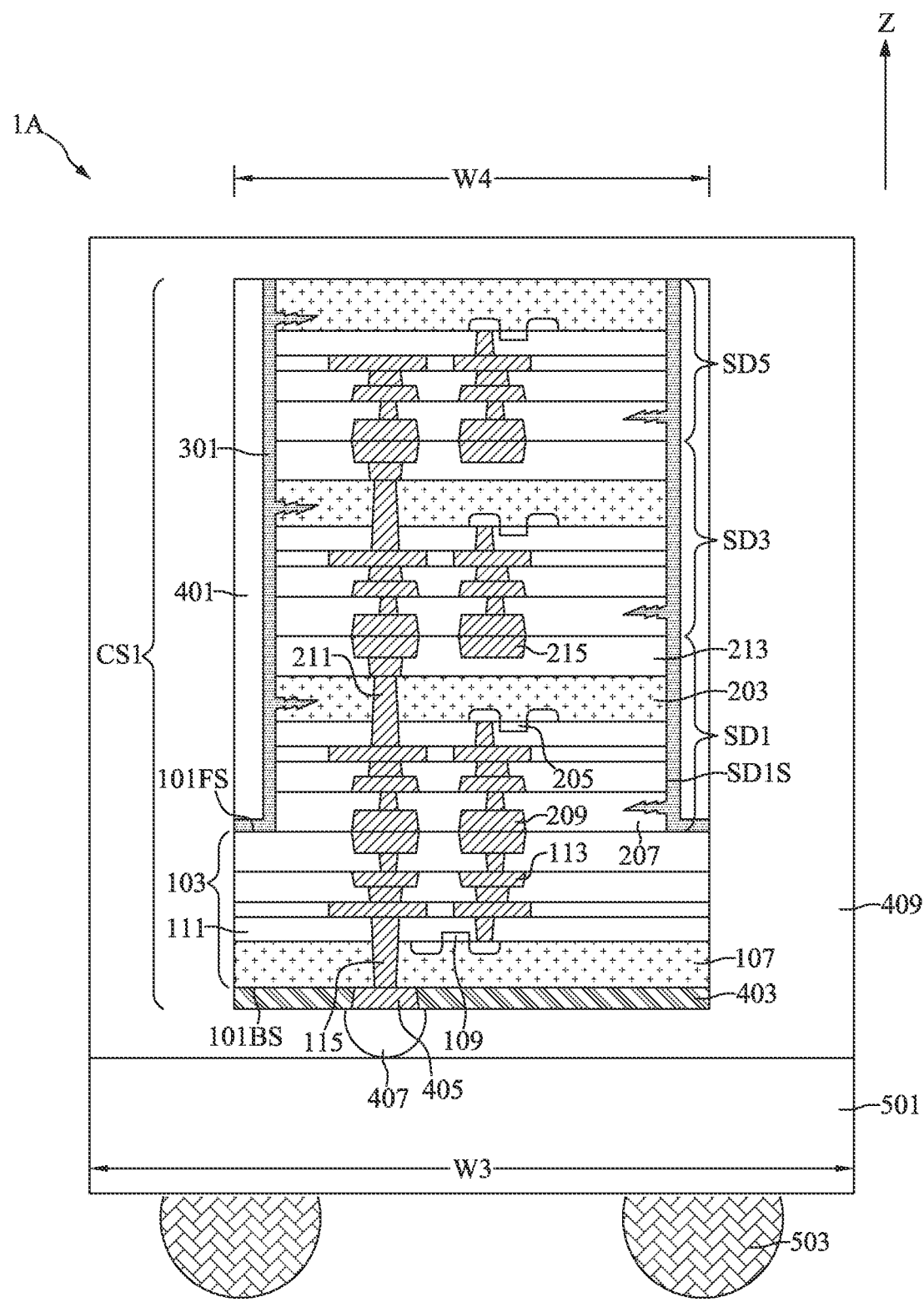

With reference to FIGS. 1 and 14, at step S23, the plurality of chip stacks CS1, CS2 may be respectively correspondingly bonded onto a plurality of package substrates 501, and a plurality of second connectors 503 may be formed under the plurality of package substrates 501.

With reference to FIG. 14, the chip stack CS1 may be bonded onto a package substrate 501 through the first connector 407. In some embodiments, the width W3 of the package substrate 501 may be greater than the width W4 of the chip stack CS1. The plurality of second connectors 503 may be formed under the package substrate 501 and electrically coupled to the first connector 407 through conductive features (not shown for clarity) formed in the package substrate 501. In some embodiments, the plurality of second connectors 503 may be controlled collapse chip connection (i.e., C4) bumps formed by a C4 process.

With reference to FIG. 14, a second molding layer 409 may be formed on the package substrate 501 to completely cover the chip stack CS1. In some embodiments, the second molding layer 409 may be formed of a molding compound such as polybenzoxazole, polyimide, benzocyclobutene, epoxy laminate, or ammonium bifluoride. The second molding layer 409 may be formed by compressive molding, transfer molding, liquid encapsulant molding, and the like. For example, a molding compound may be dispensed in liquid form. Subsequently, a curing process is performed to solidify the molding compound. The formation of molding compound may overflow the package substrate 501 so that molding compound may completely cover the chip stack CS1. A planarization process such as mechanical grinding, chemical mechanical polish, or other etch back technique may be employed to remove excess portions of the molding compound and provide a substantially flat surface.

Figure 15:
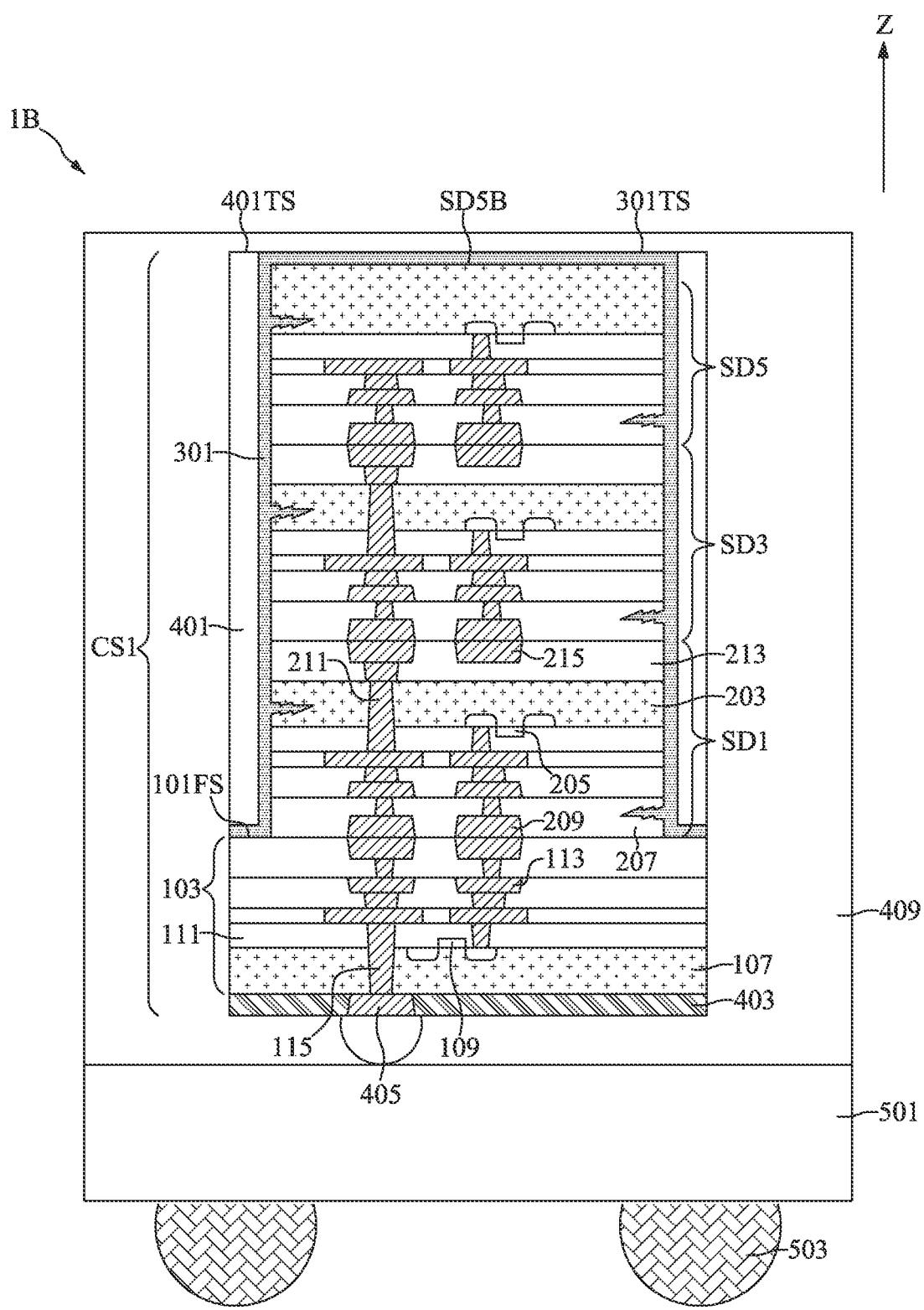
FIGS. 15 and 16 illustrate, in schematic cross-sectional view diagrams, semiconductor devices in accordance with some embodiments of the present disclosure.
Figure 16:
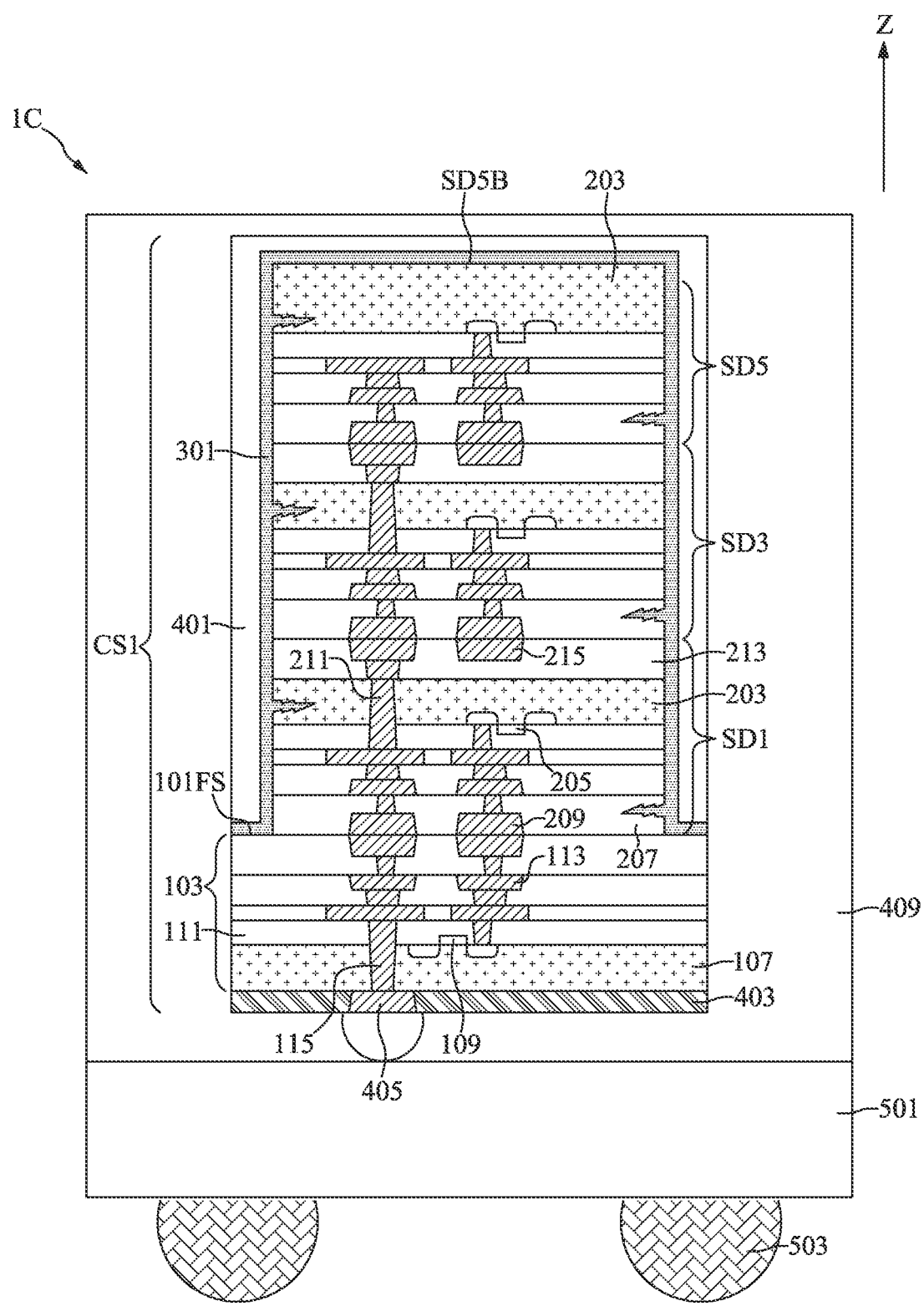

FIGS. 15 and 16 illustrate, in schematic cross-sectional view diagrams, semiconductor devices 1B and 1C in accordance with some embodiments of the present disclosure.

With reference to FIG. 15, the semiconductor device 1B may have a structure similar to that illustrated in FIG. 14. The same or similar elements in FIG. 15 as in FIG. 14 have been marked with similar reference numbers and duplicative descriptions have been omitted.

In the semiconductor device 1B, the re-fill layer 301 may further cover the back surface SD5B of the stacked die SD5. A portion of the second molding layer 409 may be disposed on the re-fill layer 301. The top surface 401TS of the first molding layer 401 may be substantially coplanar with the top surface 301TS of the re-fill layer 301.

With reference to FIG. 16, the semiconductor device 1C may have a structure similar to that illustrated in FIG. 14. The same or similar elements in FIG. 16 as in FIG. 14 have been marked with similar reference numbers and duplicative descriptions have been omitted.

In the semiconductor device 1C, the re-fill layer 301 may further cover the back surface SD5B of the stacked die SD5. The first molding layer 401 may completely cover the first molding layer 401. The second molding layer 409 do not contact the re-fill layer 301 or the substrate 203 of the stacked die SD5.

One aspect of the present disclosure provides a semiconductor device including a chip stack including a first base die; a first stacked die positioned on a front surface of the first base die; and a re-fill layer positioned on a sidewall of the stacked die. The re-fill layer includes silicon oxide, silicon nitride, silicon oxynitride, silicon nitride oxide, titanium oxide, aluminum oxide, or hafnium oxide.

Another aspect of the present disclosure provides a semiconductor device including a first base die; a first stacked die positioned on a front surface of the first base die; and a re-fill layer completely covering the stacked die and positioned on the front surface of the first base die. The re-fill layer includes silicon oxide, silicon nitride, silicon oxynitride, silicon nitride oxide, titanium oxide, aluminum oxide, or hafnium oxide.

Another aspect of the present disclosure provides a method for fabricating a semiconductor device including providing a base wafer including a scribing portion; bonding a first stacked die and a second stacked die onto a front surface of the base wafer through a hybrid bonding process, wherein the first stacked die and the second stacked die are opposite to each with the scribing portion interposed therebetween; conformally forming a re-fill layer to cover the first stacked die and the second stacked die; forming a first molding layer to cover the re-fill layer and configure an intermediate semiconductor device including the base wafer, the first stacked die, the second stacked die, the re-fill layer, and the first molding layer; and dicing the intermediate semiconductor device along the scribing portion to separate the first stacked die and the second stacked die, the re-fill layer, the first molding layer, and the base wafer, wherein the base wafer are separated into a first base die and a second base die after dicing. The first base die, the first stacked die, the re-fill layer, and the first molding layer together configure a first chip stack.

Due to the design of the semiconductor device of the present disclosure, the re-fill layer 301 may compensate the hardness difference and fill the cracks and seams of the plurality of stacked dies SD1, SD2, SD3, SD4, SD5, SD6. As a result, the adverse effect during dicing may be reduced or avoided. In other hands, the dicing process do not need to be over-optimized so that the cost and process complexity of fabrication of the semiconductor device 1A may be also reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a chip stack comprising:
a first base die, comprising a first dielectric layer with a first front surface;
a first stacked die positioned on the first front surface of the first base die, the first stacked die comprising a second dielectric layer with a second front surface bounded onto the first front surface of the first base die; wherein the first stacked die includes cracks positioned on a sidewall of the first stacked die; and
a re-fill layer conformally formed and positioned on the sidewall of the first stacked die; wherein the re-filled layer fills the cracks on the sidewall of the first stacked die;
wherein the re-fill layer comprises silicon oxide, silicon nitride, silicon oxynitride, silicon nitride oxide, titanium oxide, aluminum oxide, or hafnium oxide.

2. The semiconductor device of claim 1, wherein a thickness of the re-fill layer is between about 50 angstroms and about 1000 angstroms.

3. The semiconductor device of claim 2, wherein a width of the first base die is greater than a width of the first stacked die.

4. The semiconductor device of claim 3, further comprising a first molding layer positioned on a sidewall of the re-fill layer and opposite to the first stacked die.

5. The semiconductor device of claim 4, wherein the chip stack further comprises a bottom passivation layer on a back surface of the first base die, and the first front surface of the first base die and the back surface of the first base die are opposite to each other.

6. The semiconductor device of claim 5, wherein the chip stack further comprises a first connector positioned under the bottom passivation layer and opposite to the first base die.

7. The semiconductor device of claim 6, further comprising a package substrate, wherein the chip stack is positioned on the package substrate.

8. The semiconductor device of claim 7, further comprising a second connector positioned under the package substrate.

9. The semiconductor device of claim 8, wherein a width of the package substrate is greater than a width of the chip stack.

10. The semiconductor device of claim 9, further comprising a second molding layer positioned on the package substrate and covering the chip stack.

11. The semiconductor device of claim 10, wherein the re-fill layer further horizontally positioned on the first front surface of the first base die.

12. A semiconductor device, comprising:
a chip stack comprising:
a first base die, comprising a first dielectric layer with a first front surface;
a first stacked die positioned on the first front surface of the first base die, the first stacked die comprising a second dielectric layer with a second front surface bounded onto the first front surface of the first base die; wherein the first stacked die includes cracks positioned on a sidewall of the first stacked die; and
a re-fill layer conformally formed and completely covering the first stacked die and positioned on the first front surface of the first base die and on the sidewall of the first stacked die; wherein the re-filled layer fills the cracks on the sidewalls of the first stacked die;
wherein the re-fill layer comprises silicon oxide, silicon nitride, silicon oxynitride, silicon nitride oxide, titanium oxide, aluminum oxide, or hafnium oxide.

13. The semiconductor device of claim 12, wherein the chip stack further comprises a first molding layer positioned on a sidewall of the re-fill layer and completely covering the re-fill layer.

14. The semiconductor device of claim 1, wherein the re-fill layer is exposed to a plasma.

15. The semiconductor device of claim 12, wherein the re-fill layer is exposed to a plasma.

16. The semiconductor device of claim 4, wherein the first molding layer is formed of a molding compound being polybenzoxazole, polyimide, benzocyclobutene, epoxy laminate, or ammonium bifluoride.

17. The semiconductor device of claim 13, wherein the first molding layer is formed of a molding compound being polybenzoxazole, polyimide, benzocyclobutene, epoxy laminate, or ammonium bifluoride.

* * * * *